United States Patent [19]

Baber et al.

[11] Patent Number: 4,465,716

[45] Date of Patent: Aug. 14, 1984

[54] SELECTIVE DEPOSITION OF COMPOSITE MATERIALS

[75] Inventors: Samuel C. Baber, Richardson; Vernon R. Porter, Plano, both of Tex.

[73] Assignee: Texas Instruments Incorporated, Dallas, Tex.

[21] Appl. No.: 384,354

[22] Filed: Jun. 2, 1982

[51] Int. Cl.³ .................... H01L 21/21; H01L 21/268
[52] U.S. Cl. .............................. 427/53.1; 204/192 SP; 427/89; 427/93; 427/96; 427/259; 427/348; 427/349
[58] Field of Search ............... 427/35, 53.1, 96, 93, 427/89, 259, 348, 349; 204/192 SP

[56] References Cited

U.S. PATENT DOCUMENTS 4,377,421 3/1983 Wada ................................. 427/53.1
4,388,517 6/1983 Schulte .......................... 219/121 LJ
4,395,433 7/1983 Nagakubo ......................... 427/53.1

FOREIGN PATENT DOCUMENTS 2065369 6/1981 United Kingdom .

Primary Examiner—John D. Smith
Attorney, Agent, or Firm—Robert Groover; James T. Comfort; Melvin Sharp

[57] ABSTRACT

A method for selectively depositing a composite material over high-thermal-conductivity areas (such as silicon) and not over low-thermal-conductivity areas (such as oxide), which does not require any additional patterning step. A composite material, such as TiW is deposited overall by sputtering. A short pulse of light is then applied, and the composite material over the oxide separates and flakes off, while the composite material over the high-thermal-conductivity area remains in place.

16 Claims, 4 Drawing Figures

SELECTIVE DEPOSITION OF COMPOSITE MATERIALS

BACKGROUND OF THE INVENTION

The present invention relates to a method for selectively depositing a composite material over high-thermal-conductivity areas and not over low-thermal-conductivity areas, without any additional patterning step being required.

This provides a generally useful self-aligned integrated ciruit processing step, which may be used for forming contacts or for other process steps.

One difficulty in the fabrication of integrated circuit structures is the relatively large area which must be taken up by contact holes and vias. This is because, if the walls of a contact hole are too steep, step coverage problems may result when metal is deposited, so that a good electrical contection to the contact level does not result. Particularly if integrated circuits are to be formed using a large number of levels, such as double-metal circuits, a contact hole may have to be etched through a large thickness of material, and therefore may require a large width in the prior art.

A related difficulty is the vertical excursion which the topography of multi-level integrated circuits may create. That is, since the thickness variations of successive layers are cumulative, substantial thickness variation may result in the uppermost level, particularly in a structure which has more than two layers of conductors, such as a double-metal structure.

However, structures having more than two layers of conductors are highly desirable in large random logic integrated circuits, since they facilitate the circuit designer's task and reduce the average length of a connection.

Thus, it is an object of the present invention to provide a method for forming contacts to the bottom of a hole with very steep walls.

It is a further object of the present invention to provide a method for forming contacts to the bottom of a contact hole with vertical walls.

It is a further object of the present invention to provide a method for depositing a composite material selectively over exposed portions of silicon or metal, which is insensitive to the height of the area where the composite material is to be deposited within the integrated circuit structure.

SUMMARY OF THE INVENTION

The present invention provides a method for selectively depositing a composite material over high-thermal-conductivity areas (such as silicon) and not over low-thermal-conductivity areas (such as oxide), which does not require any additional patterning step. A composite material, such as TiW is deposited overall by sputtering. A short pulse of light is then applied, and the composite material over the oxide separates and flakes off, while the composite material over the high-thermal-conductivity area remains in place.

According to the present invention, there is provided: a process for selectively depositing a preselected composite material on exposed areas of high-thermal-conductivity material and not on exposed low-thermal-conductivity material, comprising the steps of: depositing a top layer of said composite material overall, said composite material being deposited with a small grain size; irradiating said top layer at an absorbed energy density of greater than 0.05 Joules per square centimeter, whereby said top layer loses its adhesion to said low-thermal-conductivity material; and mechanically removing remaining portions of said top layer from above said low-thermal-conductivity layer.

BRIEF DESCRIPTION OF THE DRAWINGS

The present invention will be described with reference to the accompanying drawings, wherein.

DESCRIPTION OF THE PREFERRED EMBODIMENTS

The present invention teaches a method of repeated deposition of thin films of metal or silicide, followed by removal of the metal from areas apart from the contact locations. Since the present invention provides a basic capability in integrated ciruit processing, numerous variations in parameters and materials may also be used in practicing the invention.

Figure 1:
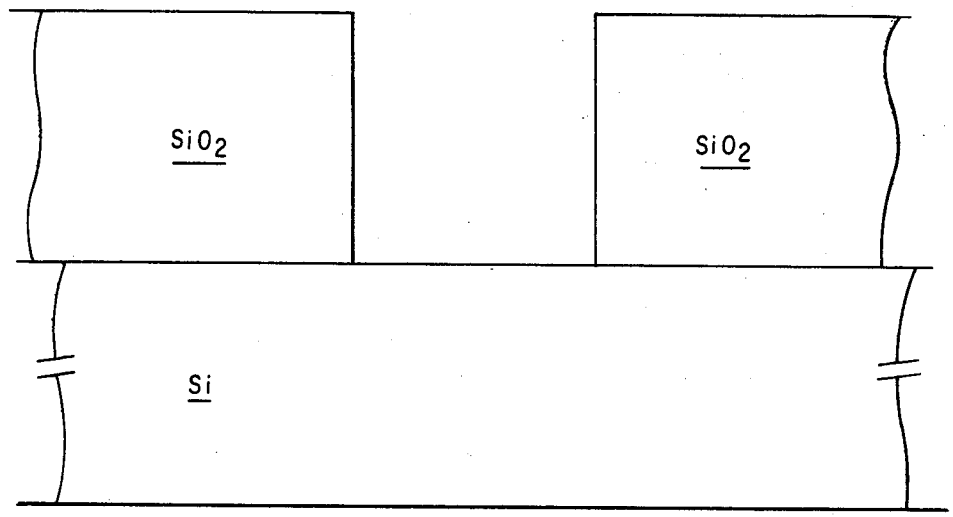
FIG. 1 shows an area where an insulator has been etched to expose a contact area of a semiconductor substrate.
Figure 2:
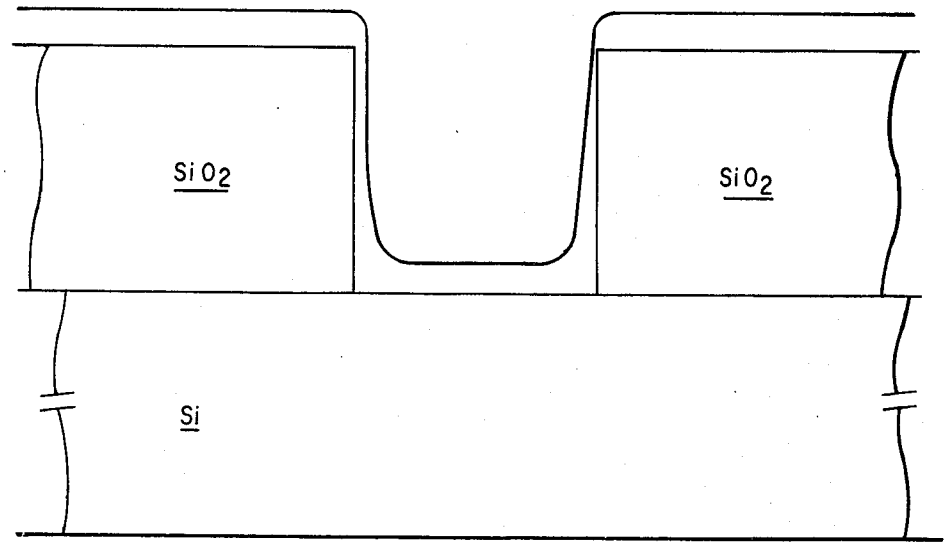
FIG. 2 shows a uniform thin film deposited over the structure of FIG. 1.
Figure 3:
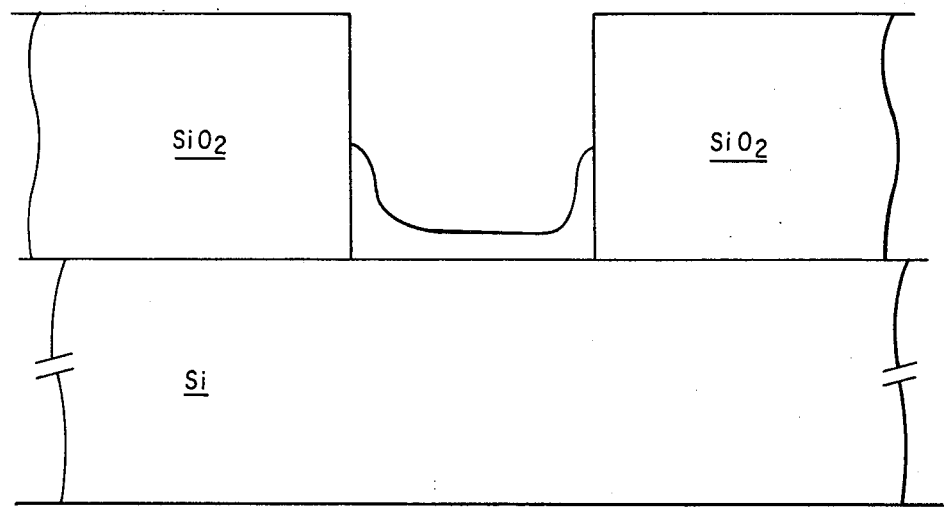
FIG. 3 shows a further stage of processing after the thin film shown in FIG. 2 has been removed except over the contact area.

FIG. 1 shows an example of a contact area in an integrated circuit structure. Shown schematically is a layer of oxide over silicon substrate, where a hole has been etched in the oxide to permit contact to the silicon substrate a metal layer. The width of the hole is irrelevant, but is 3 microns in a sample embodiment. In the present invention, this contact hole can be etched using an extremely anisotropic etch, so that the contact hole has steep or completely vertical walls.

The present invention is used to selectively deposit a composite material in the contact hole, but not over the surface of the oxide. That is, the desired composite material is first deposited overall, and then is selectively removed from on the oxide.

The presently preferred embodiment effects selective deposition of a compound of titanium and tungsten (TiW), containing from 2 to 20% titanium. However, the present invention is also applicable to a great variety of other materials.

A key criterion for selecting composite materials for application of the present invention is the density of the composite material, as compared to the densities of the components of the composite. That is, if the volume of a compound is smaller than the solid volume of the components of the compound, the present invention can be applied to selectively deposit that compound. This volumetric difference is characteristic of most intermetallic compounds. It is also characteristic of most silicides, particularly including titanium silicide.

It is particularly desirable that the initial deposition of the composite material be performed by sputtering. As-deposited sputtered material is typically nearly amorphous, and has very small grain size (less than 50 Angstroms) and has not yet been formed into the crystallized characteristic of the compound material. Typically a small but significant percentage of oxygen will also be incorporated in the as-deposited sputtered layer, which is believed to further assist in preventing recrystallization until flash heating occurs.

Preferably the deposition conditions are selected to impose substantial tensile stress in the as-deposited film at room temperature.

Thus, a thin film of the selected composite material is deposited overall by sputtering. In a sample embodiment of the present invention, where the contact hole is one micron deep, a 300 nm layer of TiW is deposited first, by RF sputtering at a 200° C. substrate temperature. Many other composite materials can be used, intermetallic compounds are particularly desirable.

A pulse of radiant energy is then applied. In the presently preferred embodiment, a Q-switched laser, such a ruby laser, is used to apply a pulse of 0.5 Joules per square centimeter with a time duration of about 30 nanoseconds. The result of such a short pulse is that the portion of the metallization layer 10 over the oxide layer 12 will be shattered, due to the physical stress caused by the extremely rapid temperature change in the metal layer. The rapid temperature rise in the as-deposited layer precipitates a phase change, wherein the as-deposited material is transformed into the crystal lattice characteristic of the composite material. Due to the volumetric difference thus caused, additional tensile stress is imposed on the film, in addition to the tensile stress caused by the sputtering conditions. Moreover, the sudden temperature change also imposes a drastic temperature gradient at the interface between the layer of composite material and the underlying oxide. The combination of increased tensile stress and reduced adhesion causes the composite material over the oxide to lose adhesion to the oxide, and flake off. The heat-sinked portion of the metal layer over the exposed contact will not be heated to as high a temperature, and will be cooled more rapidly, so that the heat-induced stress is lower and is more quickly relieved. The composite material in these areas will typically be annealed by the (smaller) local temperature rise. Once the metal over the oxide has been shattered, it can be physically removed by, e.g., floating off with an airjet. Where an extremely short pulse is used, energy densities as low as 0.1 Joules per square centimeter may be used, as long as the power density is at least a kilowatt per square centimeter.

The composite material thickness is preferably kept thin, to enhance the effect of thermal shock at the film/oxide interface. Specifically, the as-deposited film thickness should preferably be less than one micron. However, much higher film thicknesses can be used, as long as sufficiently high total energy density is absorbed proportioned to the thickness, although this is not the most preferred way to practice the present invention.

In addition, it is preferable that a minimum thickness for the as-deposited layer be observed. This is so that the adhesion to the underlying oxide (or other insulator) does not dominate the cohesion of the as-deposited layer. That is, an excessively thin layer may shatter in place, rather than separating from the oxide. Thus, the present invention is preferably practiced with as-deposited layer which has a total thickness of at least 100 nanometers, although the present invention can also be practiced, in less preferred embodiments, with as-deposited thicknesses down to 10 nanometers. The minimum thickness is related to the tensile characteristics of the particular composite material used. That is, where the material used has a lower tensile strength and lower ductility, thinner as-deposited layers can be used. Low ductility is generally desirable in practicing the present invention.

It is also preferable that the composite material used should not have too high adhesion to oxide, or to whatever insulator material is used for the underlying layer. However, this is typically not a very significant restraint on the choice of materials. One cooperative effect which is believed to assist in achieving the novel effect attained by the present invention is differential adhesion. That is, TiW is believed to adhere more strongly to silicon, or to another metal, than to oxide.

The energy density may also be stated, as a function of the thickness of the as-deposited layer, as at least 100 microJoules per square centimeter per nanometer of as-deposited layer. However, this minimum energy requirement is affected by the thermo-dynamics of the transformation which produces a compound material from the as-deposited composite layer. That is, where the phase transformation into the compound material is particularly exothermic, a smaller input energy is required.

It should be noted, in connection with all the discussions of power and energy requirements in the present application, that the relevant measurement is absorbed power or energy. That is where a very reflective material is used, a larger incident power must be applied to achieve the same absorbed power level.

Adjacent to the contact area, "wings" of unremoved compound material will remain, due to lateral heat transfer through the composite material. If this feature is undesirable, it may be removed by isotropic etch. This will produce a more planar metal profile which is recessed in the contact hole, and selective deposition steps may then be applied again to fill the hole to its top with a planar metal surface.

Figure 4:
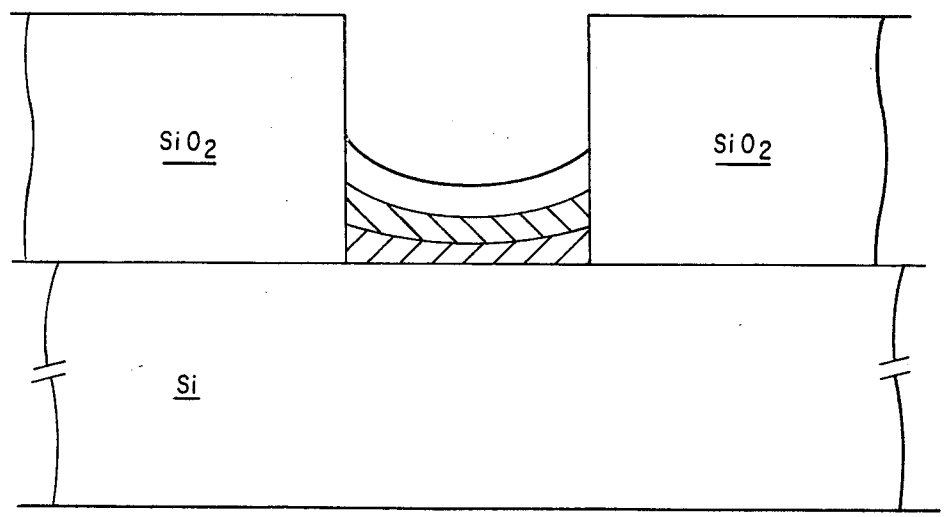
FIG. 4 shows a multilayer structure fabricated by the method of the present invention.

The present invention can be used for repetitive deposition of the same material, and can also be applied to sequential deposition of different materials. In one example, a material to assist ohmic contact formation (such as gold-germanium or other gold alloy) is applied first, a diffusion barrier (such astitanium-tungsten) is applied next, and a material such as titanium silicide for low contact resistance is applied last. An example of this structure is shown in FIG. 4.

For simplicity, the present invention has been discussed as if a contact were to be formed through a single thick oxide layer. However, multiple intermediate stages of device structure will typically have been fabricated in other areas of an integrated circuit structure. Since these intermediate structural levels are not relevant to the process of contact formation, they are not specifically discussed here.

The method of the present invention may also be applied as a lift-off process. That is a layer of a composite material, such as TiW, can be sputter-deposited first, and a layer of a second material, which need not be a composite, is then deposited on top of the composite material, before the irradiation step. When irradiation is applied, the energy density must be increased to compensate for heating of the upper layer, but separation of the TiW (or other composite material) still occurs and the second deposited layer is also separated thereby.

In one example of this embodiment, 1500 Angstroms of TiW are first deposited by RF sputtering, and 4000 Angstroms of gold are then deposited. Pulsed laser illumination is then applied at about one Joule per square centimeter, and the deposited layers are observed to flake off of oxide areas and to remain intact over contact areas. This has also been successfully demonstrated with 1500 Angstroms of chromium on top of 300 Angstroms of TiW.

In practicing this embodiment of the present invention, it is preferable, although not strictly necessary, that the upper layer deposited be sputter deposited. This is to prevent partial heating, and partial annealing, of the layer of composite material when the upper layer is deposited.

It is also preferable, although not strictly necessary, that the upper layer be deposited in tension.

It will be obvious to those skilled in the art that a broader range of equivalents may be used in practicing the invention, which is not limited except as specified in the following claims.

What we claim is:

1. A process for selectively depositing a preselected composite material having at least two component elements on exposed areas of high-thermal-conductivity material and not on exposed low-thermal-conductivity material, comprising the steps of:
    depositing a top layer of said composite material overall, said composite material being deposited with a small grain size;
    irradiating said top layer at an absorbed energy density of greater than 0.05 Joules per square centimeter, whereby said top layer loses its adhesion to said low-thermal-conductivity material; and
    mechanically removing remaining portions of said top layer from above said low-thermal-conductivity layer.

2. A process for selectively depositing a preselected composite material having at least two component elements on exposed areas of high-thermal-conductivity material and not on exposed low-thermal-conductivity material, comprising the steps of:
    depositing a top layer of said composite material overall, said composite material being deposited with a small grain size;
    irradiating said top layer at an absorbed energy density of greater than 100 microJoules per square centimeter per nanometer of top layer, whereby said top layer loses its adhesion to said low-thermal-conductivity material; and
    mechanically removing remaining portions of said top layer from above said low-thermal-conductivity material.

3. A process for selectively depositing TiW on exposed areas of highthermal-conductivity material and not on exposed low-thermal-conductivity material, comprising the steps of:
    depositing a top layer of TiW overall, said top layer being deposited with a small grain size;
    irradiating said top layer at an absorbed energy density of greater than 0.05 Joules per square centimeter, whereby said top layer loses its adhesion to said low-thermal-conductivity material; and
    mechanically removing remaining portions of said top layer from above said low-thermal-conductivity material.

4. The process of claim 1 or 2, wherein said composite material comprises first and second component elements in a given proportion, wherein said first and second components in said proportion can form an alloy having a smaller volume than the sum of the separate volumes of the same total mask of said first and second respective components in said given proportion.

5. The method of claim 1, 2, or 3, wherein said top layer is deposited by sputtering.

6. The method of claim 1, 2, or 3, wherein said top layer is in tension before said irradiation step.

7. The method of claim 5, wherein said top layer is in tension before said irradiation step.

8. The method of claim 1, 2, or 3, wherein said top layer has a thickness greater than 100 nanometers.

9. The method of claim 5, wherein said sputtering incorporates a small percentage of oxygen into said top layer.

10. A method for selectively depositing a desired material on exposed areas of high-thermal-conductivity material and not on exposed areas of low-thermal-conductivity material, comprising the steps of:
    depositing a lifting layer of a composite material overall, said composite material having at least two component elements and being deposited with a small grain size;
    depositing a top layer of said desired material overall, on said lifting layer of said composite material;
    irradiating said lifting layer and said top layer at an absorbed energy density of greater than 100 microJoules per nanometer of total thickness of said lifting layer and said top layer together, whereby said lifting layer loses its adhesion to said low-thermal-conductivity layer; and
    mechanically removing remaining portions of said top layer and said lifting layer from above said low-thermal-conductivity material.

11. The method of claim 1 or 2, wherein said composite material is a silicide.

12. The method of claim 11, wherein said composite material comprises titanium silicide.

13. The method of claim 1 or 2, wherein said composite material comprises an intermetallic compound.

14. The method of claim 1, 2, or 3, wherein said irradiation step applies an energy density which is not greater than ½ Joule per square centimeter.

15. The method of claim 1, 2, or 3, wherein said irradiation step applies a pulse having a duration not greater than about 30 nanoseconds.

16. The method of claim 1, 2, or 3, wherein said top layer has a thickness which is not greater than 300 nanometers.

* * * * *